(12) United States Patent
Kim et al.

(10) Patent No.: US 10,832,848 B2
(45) Date of Patent: Nov. 10, 2020

(54) LOW DC RESISTANCE AND HIGH RF RESISTANCE POWER AMPLIFIER CHOKE INDUCTOR

(71) Applicant: QUALCOMM Incorporated, San Diego, CA (US)

(72) Inventors: Daeik Daniel Kim, Del Mar, CA (US); Bonhoon Koo, San Diego, CA (US); Babak Nejati, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 141 days.

(21) Appl. No.: 15/722,446

(22) Filed: Oct. 2, 2017

(65) Prior Publication Data

US 2018/0374622 A1    Dec. 27, 2018

Related U.S. Application Data

(60) Provisional application No. 62/525,114, filed on Jun. 26, 2017.

(51) Int. Cl.
| | | |
|---|---|---|
| *H01F 17/00* | (2006.01) | |
| *H01F 41/04* | (2006.01) | |
| *H05K 1/16* | (2006.01) | |
| *H01F 27/28* | (2006.01) | |
| *H05K 3/46* | (2006.01) | |

(52) U.S. Cl.
CPC ....... *H01F 17/0013* (2013.01); *H01F 41/041* (2013.01); *H05K 1/165* (2013.01); *H01F 2027/2809* (2013.01); *H05K 3/46* (2013.01); *H05K 2201/09272* (2013.01); *H05K 2201/09281* (2013.01); *H05K 2201/09672* (2013.01); *H05K 2201/10098* (2013.01)

(58) Field of Classification Search
CPC ................... H01F 17/0013; H01F 2027/2809
USPC ................................................ 336/200, 232
See application file for complete search history.

(56) References Cited

U.S. PATENT DOCUMENTS

| | | | | |
|---|---|---|---|---|
| 3,960,803 A | * | 6/1976 | Smith ...................... | H01B 3/48 523/222 |
| 4,760,365 A | * | 7/1988 | Bailey ...................... | H01F 6/06 335/216 |

(Continued)

FOREIGN PATENT DOCUMENTS

| | | | | |
|---|---|---|---|---|
| JP | 09283335 A | * | 10/1997 | |
| JP | H09283335 A | | 10/1997 | |
| JP | 2002246231 A | * | 8/2002 | ......... H01F 17/0013 |

OTHER PUBLICATIONS

Manikandan R.R., et al., "Design and Modeling of High-Q Variable Width and Spacing, Planar and 3-D Stacked Spiral Inductors", IEEE International Symposium on VLSI Design and Test, Jul. 2014, pp. 1-6.

(Continued)

*Primary Examiner* — Tszfung J Chan
(74) *Attorney, Agent, or Firm* — Seyfarth Shaw LLP

(57) ABSTRACT

A multi-layer spiral inductive array includes a first multi-layer spiral inductor with a second layer matching a spiral pattern of a first layer. The multi-layer spiral inductive array also includes a second multi-layer spiral inductor with a third layer matching a spiral pattern of a fourth layer. The second multi-layer spiral inductor is coupled in series with the first multi-layer spiral inductor.

19 Claims, 10 Drawing Sheets

(56) References Cited

U.S. PATENT DOCUMENTS

| | | | |
|---|---|---|---|
| 6,894,598 B2* | 5/2005 | Heima | H01F 17/0013 |
| | | | 257/E27.046 |
| 6,970,057 B2 | 11/2005 | Lin et al. | |
| 7,423,500 B2 | 9/2008 | Ishiwata | |
| 8,193,781 B2* | 6/2012 | Lin | H02K 3/26 |
| | | | 322/3 |
| 8,212,155 B1* | 7/2012 | Wright | H01L 23/00 |
| | | | 174/259 |
| 8,665,054 B2* | 3/2014 | Stecher | H01L 23/5227 |
| | | | 336/200 |
| 9,013,248 B2 | 4/2015 | Yamaguchi | |
| 9,147,513 B2 | 9/2015 | Song et al. | |
| 2007/0045773 A1* | 3/2007 | Mi | H01L 27/0688 |
| | | | 257/531 |
| 2009/0243780 A1* | 10/2009 | Inoue | H01F 1/15366 |
| | | | 336/200 |
| 2010/0327976 A1* | 12/2010 | Klemens | H01L 23/645 |
| | | | 330/277 |
| 2012/0188047 A1* | 7/2012 | Groves | H01F 17/0013 |
| | | | 336/200 |
| 2016/0087585 A1* | 3/2016 | Ma | H03F 1/0205 |
| | | | 330/297 |
| 2016/0134249 A1* | 5/2016 | Li | H01L 23/66 |
| | | | 333/247 |
| 2017/0133142 A1* | 5/2017 | Park | H01F 19/04 |

OTHER PUBLICATIONS

International Search Report and Written Opinion—PCT/US2018/035898—ISA/EPO—dated Aug. 21, 2018.

* cited by examiner

US 10,832,848 B2

LOW DC RESISTANCE AND HIGH RF RESISTANCE POWER AMPLIFIER CHOKE INDUCTOR

CROSS-REFERENCE TO RELATED APPLICATION

The present application claims the benefit of U.S. Provisional Patent Application No. 62/525,114, filed on Jun. 26, 2017, and titled "LOW DC RESISTANCE AND HIGH RF RESISTANCE POWER AMPLIFIER CHOKE INDUCTOR," the disclosure of which is expressly incorporated by reference herein in its entirety.

TECHNICAL FIELD

The present disclosure generally relates to choke inductors. More specifically, the present disclosure relates to low direct current (DC) resistance and high radio frequency (RF) resistance power amplifier (PA) choke inductors.

BACKGROUND

A choke is an inductor used to block higher frequency alternating current in an electrical circuit, while passing a lower frequency current (e.g., direct current). In conventional systems, a choke is a coil of insulated wire wound on a magnetic core. Some choke inductors may be spiral inductors or co-spiral inductors.

To achieve stability in an amplifier, such as a radio frequency front end (RFFE) power amplifier, it is desirable to use a radio frequency choke with low direct current resistance and high radio frequency resistance. The low direct current resistance reduces voltage degradation at the power amplifier output. Conventional printed inductors may be unstable due to a high quality (Q) factor (e.g., greater than twenty). A high RF resistance or low Q factor is desirable to reduce radio frequency swing and to improve stability. It would be desirable to provide a radio frequency choke inductor with low direct current resistance and high radio frequency resistance for an RFFE power amplifier.

SUMMARY

In one aspect of the present disclosure, a multi-layer spiral inductive array is disclosed. The multi-layer spiral inductive array includes a first multi-layer spiral inductor with a second layer matching a spiral pattern of a first layer. The multi-layer spiral inductive array also includes a second multi-layer spiral inductor with a third layer matching a spiral pattern of a fourth layer. The second multi-layer spiral inductor is coupled in series with the first multi-layer spiral inductor.

Another aspect of the present disclosure is directed to a method of fabricating a multi-layer spiral inductive array. The method includes fabricating a first multi-layer spiral inductor with a second layer matching a spiral pattern of a first layer. The method also includes fabricating a second multi-layer spiral inductor with a third layer matching a spiral pattern of a fourth layer. The second multi-layer spiral inductor is coupled in series to the first multi-layer spiral inductor.

In another aspect of the present disclosure, an apparatus for inductance is disclosed. The apparatus includes a first means for providing inductance with a second layer matching a spiral pattern of a first layer. The apparatus also includes a second means for providing inductance with a third layer matching a spiral pattern of a fourth layer. The second means for providing inductance is coupled in series with the first means for providing inductance.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Mobile radio frequency (RF) chip designs (e.g., mobile RF transceivers) have migrated to deep sub-micron process nodes due to cost and power consumption considerations. The design complexity of mobile RF transceivers is further complicated by added circuit function to support communication enhancements. Further design challenges for mobile RF transceivers include analog/RF performance considerations, such as mismatch, noise, and other performance considerations. To achieve amplifier stability for a radio frequency chip, such as a radio frequency front end (RFFE) power amplifier (PA), it is desirable to use an RF choke with low direct current (DC) resistance and high RF resistance (e.g., low-Q). In the following description, an RF choke inductor is also referred to as an RF choke, a PA choke inductor, or a PA/RF choke.

Conventional RF chokes use a spiral or co-spiral design. For conventional RF chokes, DC resistance, at 85 C, is greater than or equal to 100 mOhm. Furthermore, for conventional RF chokes, the quality (Q) factor, at 800 MHz, is greater than twenty-five. Conventional RF chokes do not achieve both low DC resistance and high RF resistance. In some cases, conventional RF chokes achieve low DC resistance by using a wide trace in the spiral design. However, wide traces increase the amount of area used in the design and may also increase the Q factor. The wide trace design does not achieve the desired low DC resistance and high RF resistance.

Figure 1A:
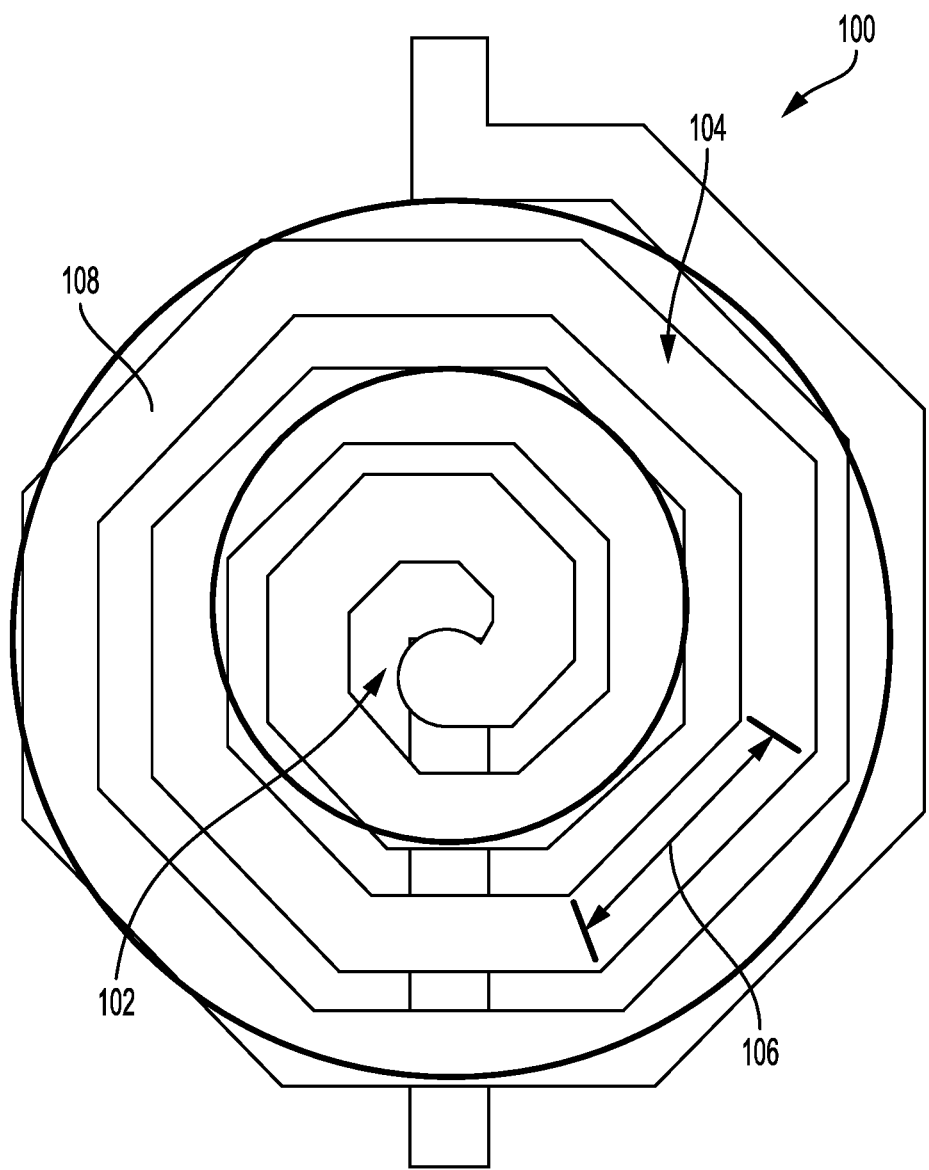
FIGS. 1A and 1B illustrate examples of spiral inductors.
Figure 1B:
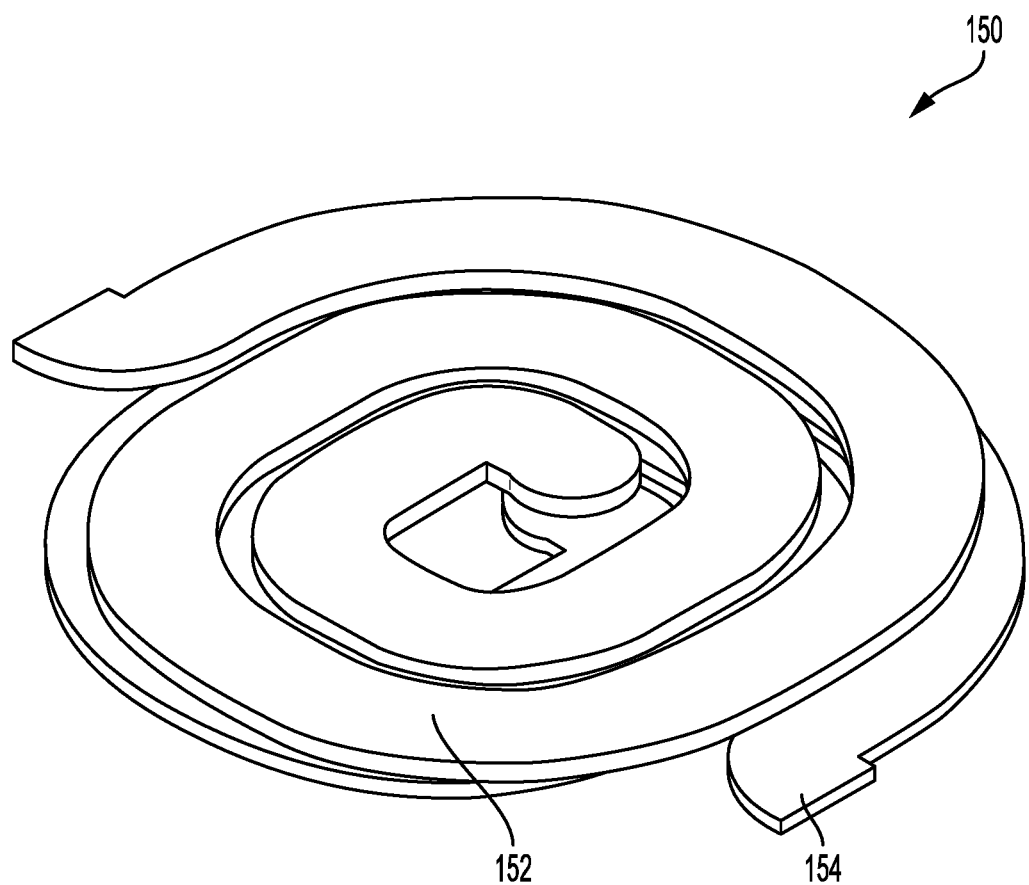

FIG. 1A illustrates an example of a conventional spiral inductor 100. As shown in FIG. 1A, the spiral inductor 100 has three and a half turns. In this example, the spiral inductor has a low-Q area 102 and high-Q area 104. The low-Q area 102 has a smaller radius than the high-Q area 104. That is, a run length 106 of traces 108 between turns in the high-Q area 104 is greater than the run length 106 of traces 108 between turns in the low-Q area 102. The increased run lengths 106 increase the Q factor in the high-Q area 104. In this example, the low-Q area 102 also includes RF-blocking turns. FIG. 1B illustrates an example of a conventional co-spiral inductor 150. As shown in FIG. 1B, the spiral pattern of a top layer 152 is different from the spiral pattern of a bottom layer 154. That is, the multiple layers 152 and 154 do not share the same spiral pattern.

The Q factor of an inductor may be reduced by reducing the run length between turns (e.g., quick turns). DC resistance may be reduced with a multiple-layer inductor. Due to limitations of conventional systems (e.g., surface mount devices (SMDs) or laminate printed inductors), conventional RF choke inductors do not achieve low DC resistance ($R_{dc}$) and high RF resistance ($R_{rf}$) (e.g., low-Q). Aspects of the present disclosure form a multiple-layer inductor with a reduced run length between turns to achieve low DC resistance (e.g., reduce voltage degradation) and high RF resistance (e.g., improve stability and reduce RF swing).

In some cases, oscillation may be caused by a PA/RF choke with a high quality (Q) factor connected to the power amplifier. That is, a high Q factor may cause a high gain. An increased amount of gain may cause feedback, which may cause instability. As such, a high Q factor may cause the power amplifier to be unstable.

In one configuration, to provide stability, a power amplifier choke (e.g., PA/RF choke) inductor is provided between the output of the supply voltage and the output of the power amplifier. A choke may provide RF gain. That is, an RF choke generates RF gain. To improve stability, a resistor may be inserted to reduce the Q factor of a choke. The resistor may reduce DC resistance. The PA/RF choke may have a low DC resistance to reduce a voltage drop at a power amplifier, while having high RF resistance (e.g., low Q factor—e.g., less than 10 or 15) to stabilize the power amplifier (e.g., reduce oscillation, reduce RF swing). High DC resistance may cause an inductor to increase power consumption, which causes a drop in voltage for a power amplifier (e.g., voltage degradation at the output of the power amplifier).

Figure 2:
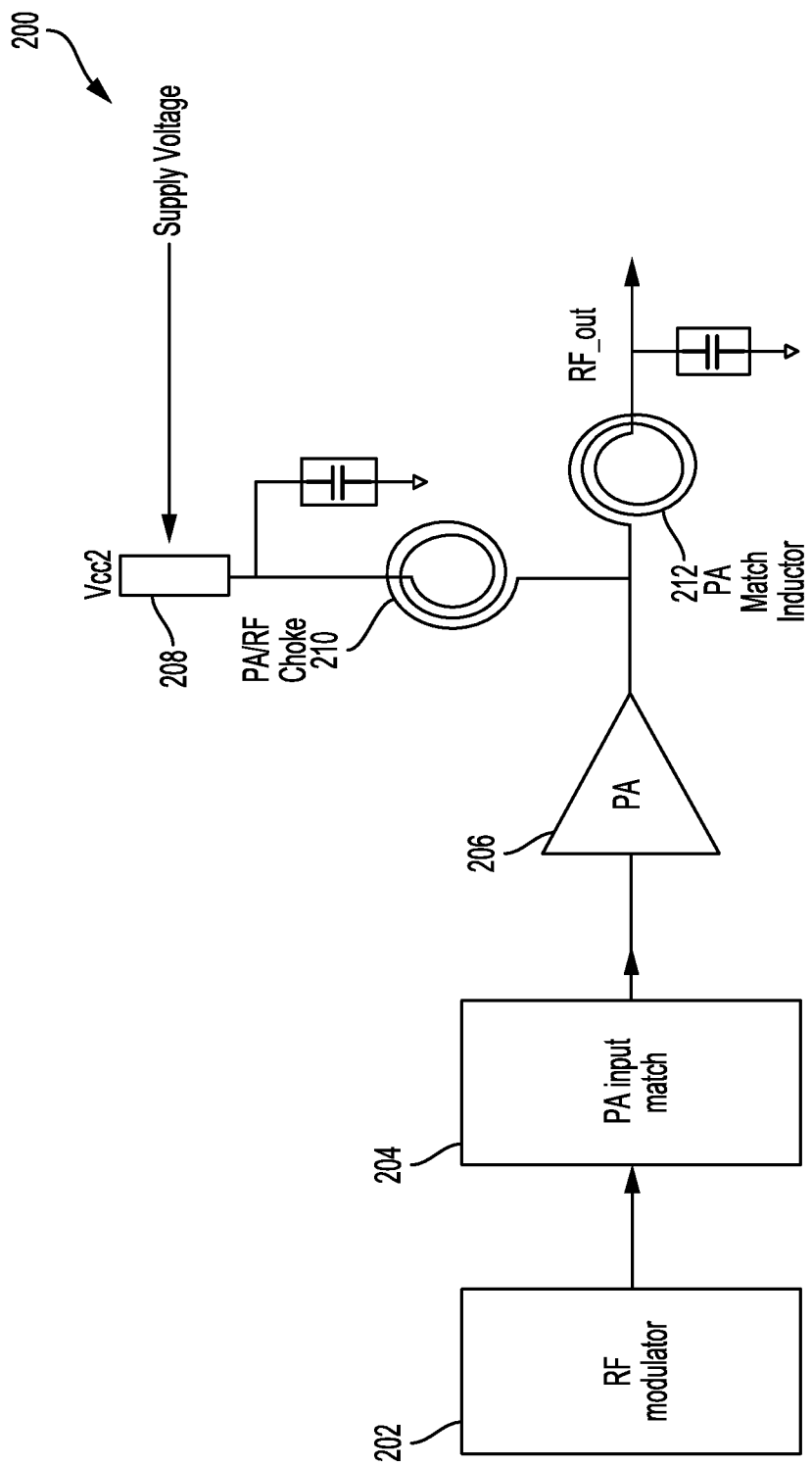
FIG. 2 illustrates an example of a circuit according to aspects of the current disclosure.

FIG. 2 illustrates an example of a portion of a circuit 200 according to aspects of the current disclosure. As shown in FIG. 2, a radio frequency (RF) modulator 202 outputs a signal to a power amplifier (PA) input matching circuit 204. A power amplifier 206 receives a matched signal from the power amplifier input matching circuit 204 and amplifies the signal. A PA/RF choke inductor 210 may receive an input from a supply voltage 208. As shown in FIG. 2, the output of the PA/RF choke inductor 210 is connected to the output of the power amplifier 206. The combined output is sent through a power amplifier match inductor 212, which couples to a radio frequency output (e.g., RF_out).

As previously discussed, in conventional systems, oscillation may be caused by the PA/RF choke inductor 210 connected to the power amplifier 206 when the choke inductor 210 has a high quality (Q) factor. In one configuration of the present disclosure, the PA/RF choke inductor 210 has a low DC resistance, while having high RF resistance, to stabilize the power amplifier 206 and to reduce voltage degradation.

Aspects of the present disclosure are directed to an RF choke including an array of close and few turned (e.g., minimal turned) multiple-layer spiral inductors. Few turned can mean, for example, the radius is tight given the trace width. Based on the design of the present disclosure, the DC resistance ($R_{dc}$) is reduced. For example, at 85 C, the DC resistance is less than 100 mOhm. Additionally, the Q factor is reduced. In other words the RF resistance ($R_{rf}$) is increased. For example, at 800 MHz, the Q factor is less than fifteen. It may be desirable to reduce the Q factor (in comparison to the Q factor of conventional spiral designs) to provide stability to the power amplifier. Aspects of the present disclosure increase the ratio $R_{rf}/R_{dc}$. For example, $R_{rf}/R_{dc}$ may be greater than twenty-two.

In one configuration, an array of multiple-layer spiral inductors is specified for a power amplifier choke with low DC resistance and high RF resistance. The spiral inductor array may include an array of two or more multiple-layer spiral inductors, such as two multiple-layer spiral inductors, three multiple-layer spiral inductors, four multiple-layer spiral inductors, etc. Of course, aspects of the present disclosure are not limited to the aforementioned number of arrays as other multiple-layer spiral inductor array configurations are contemplated. Each layer of the array is connected via the center portion (e.g., starting point) of the spiral inductor. Furthermore, each spiral inductor in an array is connected to a neighboring spiral inductor via a bottom layer or top layer of the multiple layers. Additionally, each layer of the array has the same spiral pattern. That is, the spiral pattern is repeated in a vertical direction.

Figure 3A:
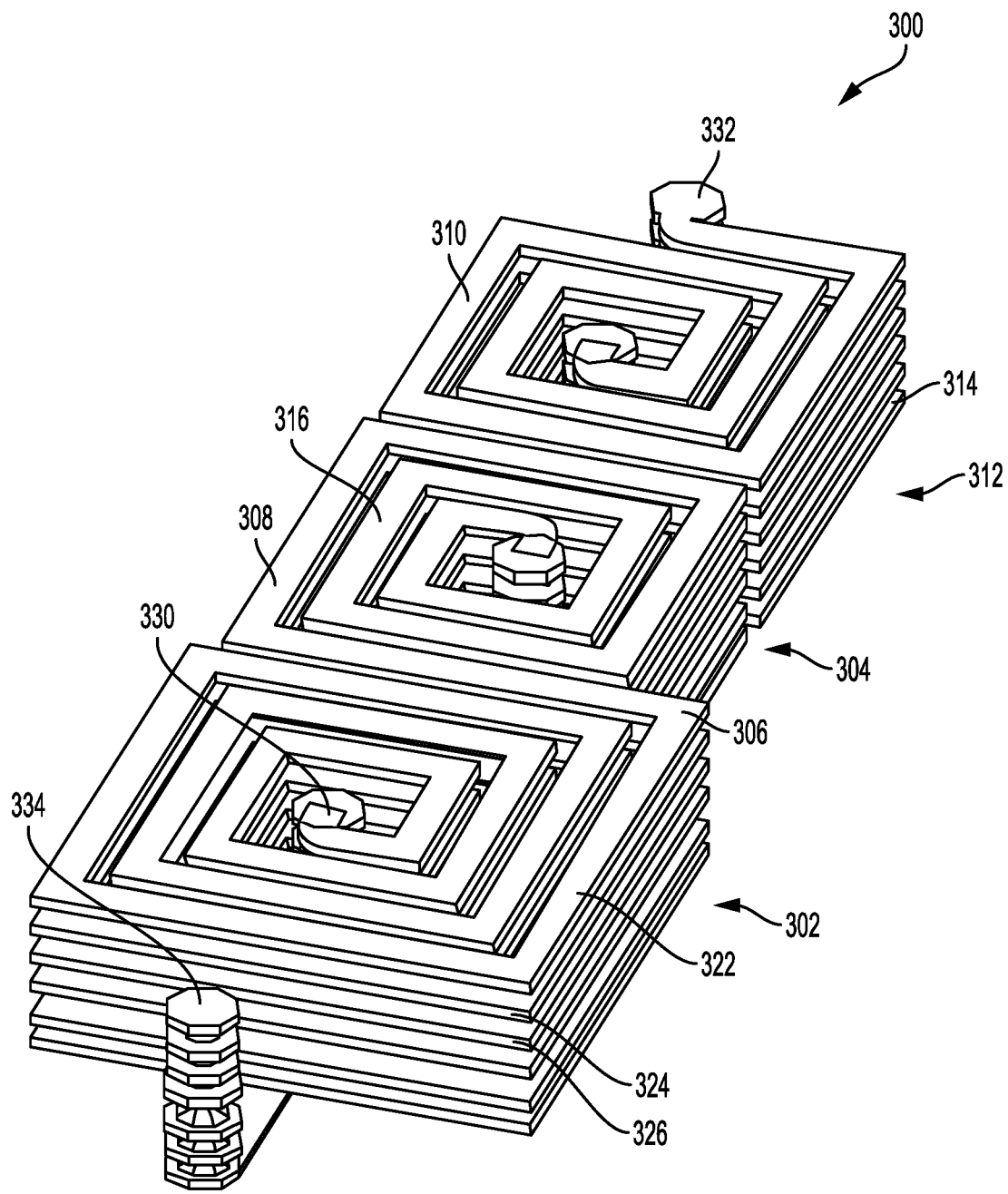
FIG. 3A-3B illustrate examples of arrays of multiple-layer spiral inductors according to aspects of the present disclosure.

FIG. 3A illustrates an example of an array of multiple-layer (e.g., multi-layer) spiral inductors 300 according to aspects of the present disclosure. The array of multiple-layer spiral inductors 300 is an array of three multiple-layer spiral inductors. As previously discussed, the array may include two or more multiple-layer spiral inductors and aspects of the present disclosure are not limited to an array of three multiple-layer spiral inductors 300. Additionally, aspects of the present disclosure are not limited to the multi-layer spiral inductors 300 having the number of layers shown in FIG. 3A, more or fewer layers are also contemplated.

As shown in FIG. 3A, a trace 306 of a first multi-layer spiral inductor 302 is coupled to a trace 308 of a second multi-layer spiral inductor 304 at a top layer 316 of the multiple layers. Although not shown in FIG. 3A, in this example, the trace 308 of the second multi-layer spiral inductor 304 is coupled to a trace 310 of a third multi-layer spiral inductor 312 at a bottom layer 314 of the multiple layers of the third multi-layer spiral inductor 312. Furthermore, a current may be received at a first end 334 of the array of multi-layer spiral inductors 300 and output at a second end 332, or vice versa.

Each layer of each multi-layer spiral inductor 302, 304, 312 is connected from the top to bottom such that each layer is connected to each other. As an example, a first layer 322 of the first multi-layer spiral inductor 302 is connected to a second layer 324 of the first multi-layer spiral inductor 302 at the center portion 330. Likewise, the second layer 324 is connected to a third layer 326 of the first multi-layer spiral inductor 302 at the center portion 330.

In one configuration, the layers of an multi-layer spiral inductor are also connected to each other at an end of the multi-layer spiral inductor. For example, in the example of FIG. 3A, the layers of the third multi-layer spiral inductor 312 are also connected to each other at the second end 332. In the example of FIG. 3A, the first end 334 may be an input port for the inductor. A stack of vias at the first end 334 connect the first end 334 to a bottom layer of the first multi-layer spiral inductor 302. The bottom layer may be a bridge to center portion 330 of the first multi-layer spiral inductor 302.

As shown in FIG. 3A, each layer of a multi-layer spiral inductor 302, 304, 312 has a same spiral pattern as other layers in the multi-layer spiral inductor 302, 304, 312. As an example, the first, second, and third layers 322, 324, 326 of the first multi-layer spiral inductor 302 have the same spiral pattern. That is, the spirals of each layer turn in the same direction and have the same trace widths and turn radii.

As shown in FIG. 3A, the traces 306, 308, 310 of each multi-layer spiral inductor 302, 304, 312 have a same width and are equally spaced from adjacent traces. In another configuration, the inner traces are narrower in comparison to the outer traces. That is, the width of the traces may expand at each loop. Likewise, the distance between traces may be greater in an inner loop in comparison to the distance between traces in an outer loop.

Figure 3B:
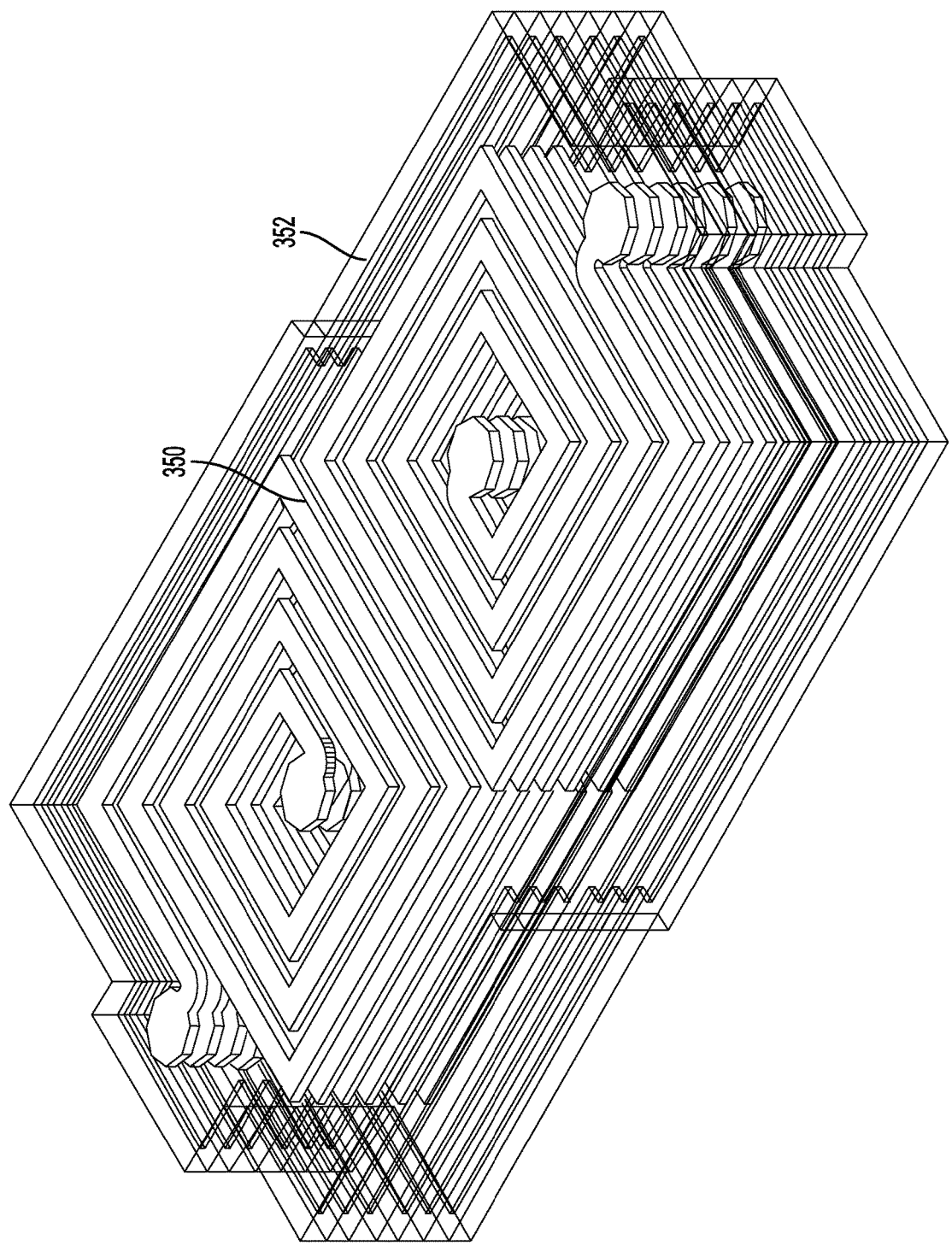

In another configuration, a ground wall surrounds the multi-layer spiral inductors. FIG. 3B illustrates an example of an array of multi-layer spiral inductors 350 according to aspects of the present disclosure. As shown in FIG. 3B, the array of multiple-layer spiral inductors 350 is an array of two multiple-layer spiral inductors. As previously discussed, the array may include two or more multiple-layer spiral inductors and aspects of the present disclosure are not limited to an array of two multiple-layer spiral inductors 350. Furthermore, as shown in FIG. 3B, a ground wall 352 surrounds the multi-layer spiral inductors 350.

Figure 4:
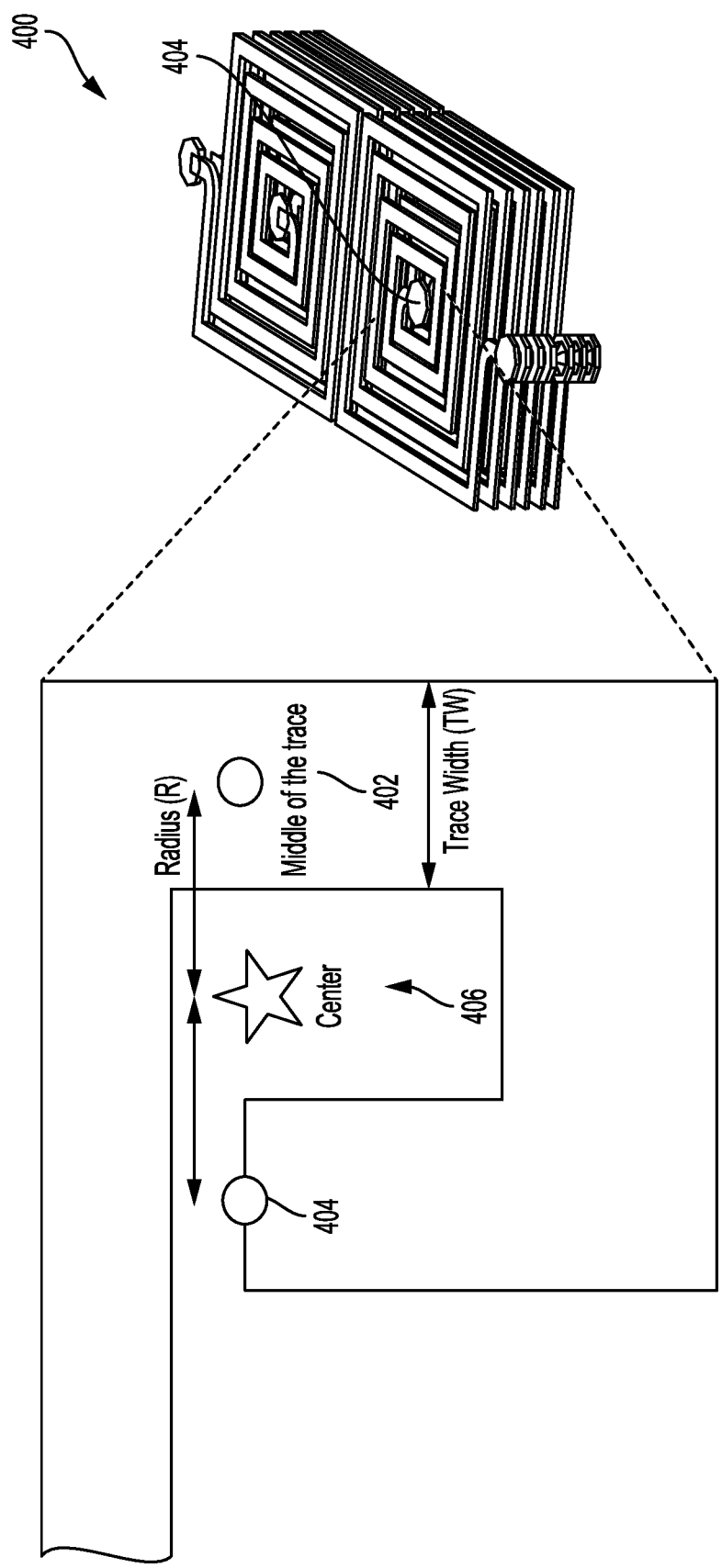
FIG. 4 illustrates an example of an expanded view of a turn radius of a multiple-layer spiral inductor according to aspects of the present disclosure.

In one configuration, a turn radius of an inner spiral of a multi-layer spiral inductor is less than twice a trace width of the multi-layer spiral inductor. FIG. 4 illustrates an example of an expanded view of a turn radius of a multi-layer spiral inductor 400 according to aspects of the present disclosure. In one configuration, the radius (r) of an inner spiral is less than twice the trace width (TW) (e.g., R<2TW), such that the Q factor is reduced. The Q factor increases as the radius increases with respect to the trace width. The radius (r) is defined as half the distance from a middle of a trace 402 to a starting point 404 of the multi-layer spiral inductor 400. That is, the radius (r) is a distance from the middle of the trace 402 of the inner spiral to a center 406 of the multi-layer spiral inductor 400. The inner spiral refers to the first spiral from the starting point 404.

Figure 5:
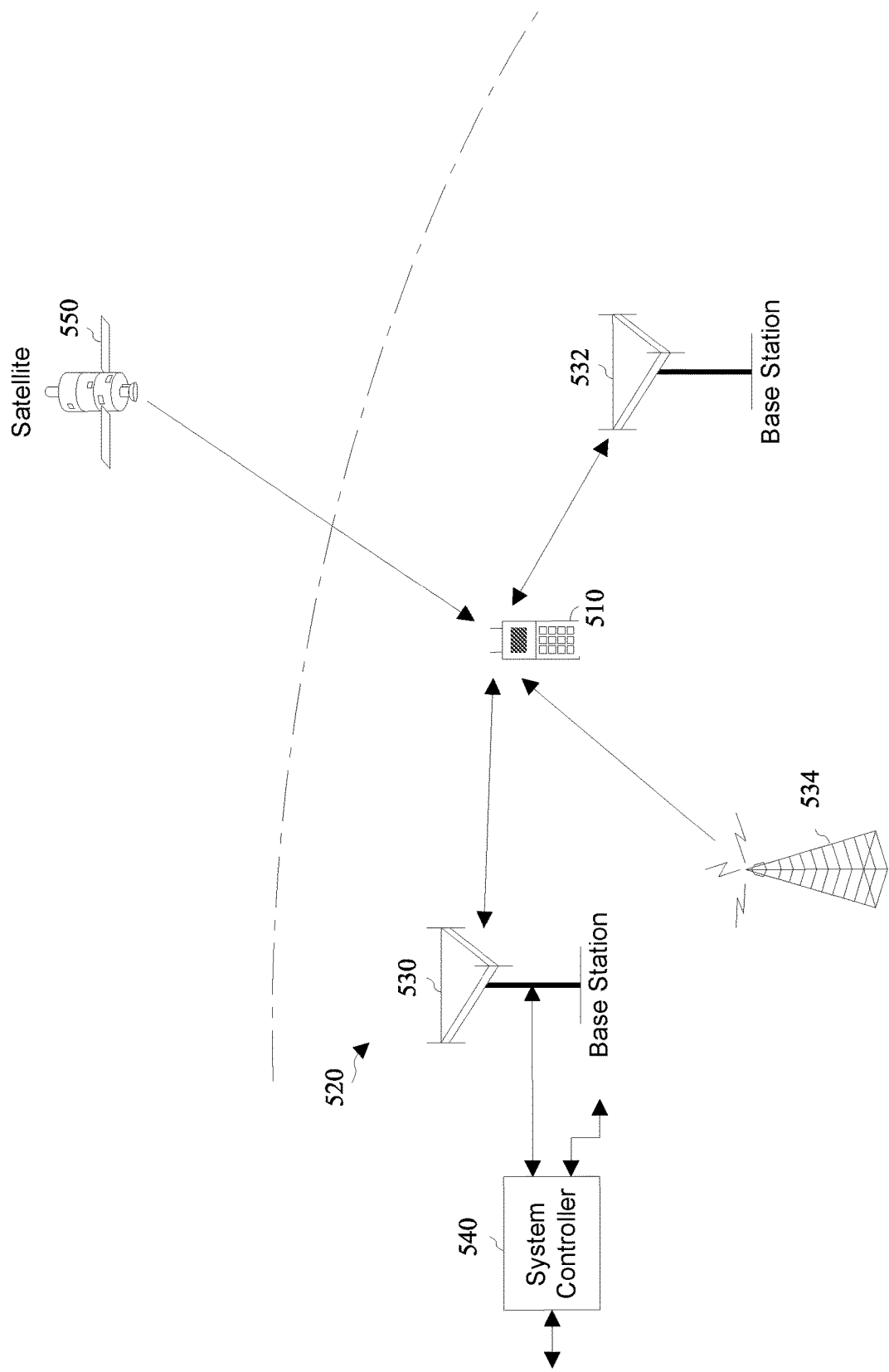
FIG. 5 shows a wireless device communicating with a wireless communication system.
Figure 6:
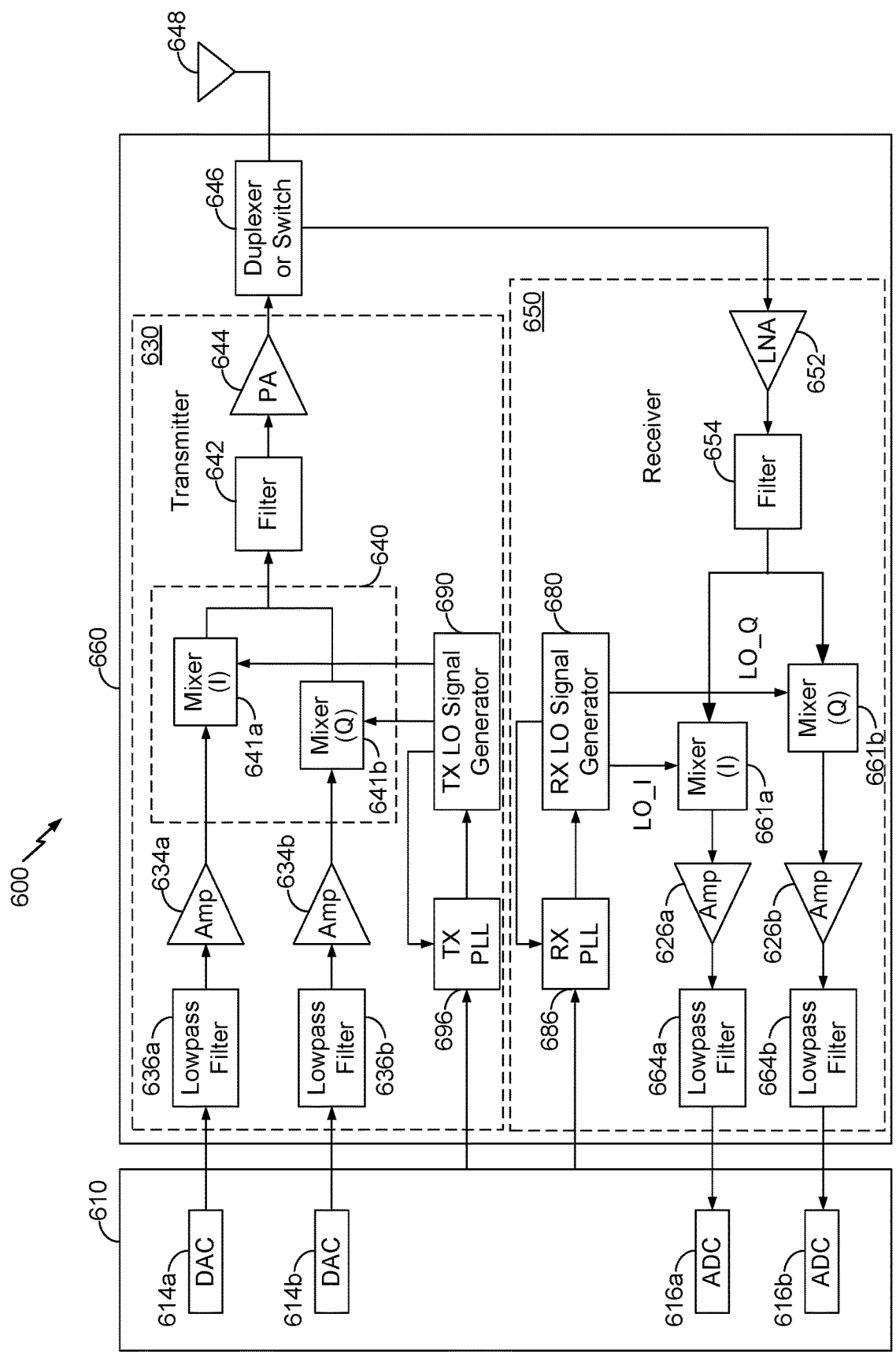
FIG. 6 shows a block diagram of the wireless device in FIG. 5, according to an aspect of the present disclosure.
Figure 7:
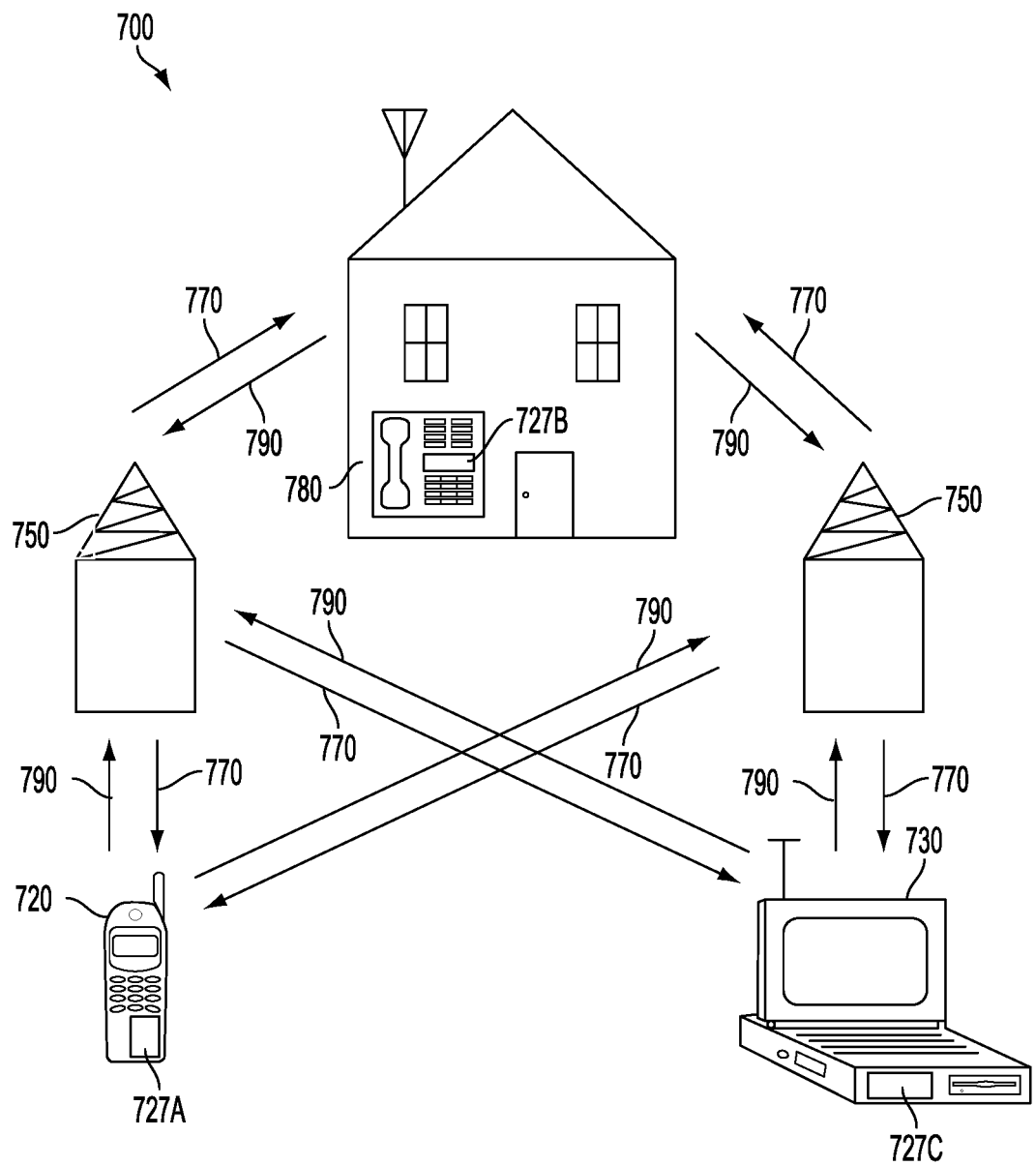
FIG. 7 is a block diagram showing an exemplary wireless communication system in which a configuration of the disclosure may be advantageously employed.

The present disclosure may be implemented in the system of FIGS. 5 and 7. More specifically, the present disclosure may be implemented in the wireless device of FIG. 6.

FIG. 5 shows a wireless device 510 communicating with a wireless communication system 520. The wireless communication system 520 may be a 5G system, a long term evolution (LTE) system, a code division multiple access (CDMA) system, a global system for mobile communications (GSM) system, a wireless local area network (WLAN) system, or some other wireless system. A CDMA system may implement wideband CDMA (WCDMA), time division synchronous CDMA (TD-SCDMA), CDMA2000, or some other version of CDMA. For simplicity, FIG. 5 shows the wireless communication system 520 including two base stations 530 and 532 and one system controller 540. In general, a wireless system may include any number of base stations and any number of network entities.

A wireless device 510 may be referred to as a user equipment (UE), a mobile station, a terminal, an access terminal, a subscriber unit, a station, etc. The wireless device 510 may also be a cellular phone, a smartphone, a tablet, a wireless modem, a personal digital assistant (PDA), a handheld device, a laptop computer, a Smartbook, a netbook, a cordless phone, a wireless local loop (WLL) station, a Bluetooth device, etc. The wireless device 510 may be capable of communicating with the wireless communication system 520. The wireless device 510 may also be capable of receiving signals from broadcast stations (e.g., a broadcast station 534), signals from satellites (e.g., a satellite 550) in one or more global navigation satellite systems (GNSS), etc. The wireless device 510 may support one or more radio technologies for wireless communication such as LTE, CDMA2000, WCDMA, TD-SCDMA, GSM, 802.11, etc. The wireless device 510 may support carrier aggregation, which is operation on multiple carriers. Carrier aggregation may also be referred to as multi-carrier operation. According to an aspect of the present disclosure, the wireless device 510 may be able to operate in low-band from 698 to 960 megahertz (MHz), mid-band from 1475 to 2170 MHz, and/or high-band from 2300 to 2690 MHz, ultra-high band from 3400 to 3800 MHz, and long term evolution (LTE) in LTE unlicensed bands (LTE-U/LAA) from 5550 MHz to 5950 MHz. Low-band, mid-band, high-band, ultra-high band, and LTE-U refer to five groups of bands (or band groups), with each band group including a number of frequency bands (or simply, "bands"). For example, in some systems each band may cover up to 200 MHz and may include one or more carriers. For example, each carrier may cover up to 40 MHz in LTE. Of course, the range for each of the bands is merely exemplary and not limiting, and other frequency ranges may be used. LTE Release 11 supports 35 bands, which are referred to as long term evolution/universal mobile telecommunications service (LTE/universal mobile telecommunications service (UMTS)) bands and are listed in 3GPP TS 36.101. The wireless device 510 may be configured with up to 5 carriers in one or two bands in LTE Release 11.

FIG. 6 shows a block diagram of an exemplary design of a wireless device 600, such as the wireless device 510 shown in FIG. 5. FIG. 6 shows an example of a transceiver 660, which may be a wireless transceiver (WTR). In general, the conditioning of the signals in a transmitter 630 and a receiver 650 may be performed by one or more stages of amplifier(s), filter(s), upconverters, downconverters, and the like. These circuit blocks may be arranged differently from the configuration shown in FIG. 6. Furthermore, other circuit blocks not shown in FIG. 6 may also be used to condition the signals in the transmitter 630 and receiver 650. Unless otherwise noted, any signal in FIG. 6, or any other illustrations in the drawings, may be either single-ended or differential. Some circuit blocks in FIG. 6 may also be omitted.

In the example shown in FIG. 6, the wireless device 600 generally includes the transceiver 660 and a data processor 610. The data processor 610 may include a memory (not shown) to store data and program codes, and may generally include analog and digital processing elements. The transceiver 660 may include the transmitter 630 and receiver 650 that support bi-directional communication. In general, the wireless device 600 may include any number of transmitters and/or receivers for any number of communication systems and frequency bands. All or a portion of the transceiver 660 may be implemented on one or more analog integrated circuits (ICs), radio frequency (RF) integrated circuits (RFICs), mixed-signal ICs, and the like.

A transmitter or a receiver may be implemented with a super-heterodyne architecture or a direct-conversion architecture. In the super-heterodyne architecture, a signal is frequency-converted between radio frequency and baseband in multiple stages, e.g., from radio frequency to an intermediate frequency (IF) in one stage, and from intermediate frequency to baseband in another stage for a receiver. In the direct-conversion architecture, a signal is frequency-converted between radio frequency and baseband in one stage. The super-heterodyne and direct-conversion architectures may use different circuit blocks and/or have different requirements. In the example shown in FIG. 6, the transmitter 630 and the receiver 650 are implemented with the direct-conversion architecture.

In a transmit path, the data processor 610 processes data to be transmitted. The data processor 610 also provides in-phase (I) and quadrature (Q) analog output signals to the transmitter 630 in the transmit path. In an exemplary aspect, the data processor 610 includes digital-to-analog converters (DACs) 614a and 614b for converting digital signals generated by the data processor 610 into the in-phase (I) and quadrature (Q) analog output signals (e.g., I and Q output currents) for further processing.

Within the transmitter 630, lowpass filters 636a and 636b filter the in-phase (I) and quadrature (Q) analog transmit signals, respectively, to reduce undesired images caused by the prior digital-to-analog conversion. Amplifiers (Amp) 634a and 634b amplify the signals from lowpass filters 636a and 636b, respectively, and provide in-phase (I) and quadrature (Q) baseband signals. An upconverter 640 including upconversion mixers 641a and 641b upconverts the in-phase (I) and quadrature (Q) baseband signals with in-phase (I) and quadrature (Q) transmit (TX) local oscillator (LO) signals from a TX LO signal generator 690 to provide an upconverted signal. A filter 642 filters the upconverted signal to reduce undesired images caused by the frequency upconversion as well as interference in a receive frequency band. A power amplifier (PA) 644 amplifies the signal from filter 642 to obtain the desired output power level and provides a transmit radio frequency signal. The transmit radio frequency signal is routed through a duplexer/switch 646 and transmitted via an antenna 648.

In a receive path, the antenna 648 receives communication signals and provides a received radio frequency (RF) signal, which is routed through the duplexer/switch 646 and provided to a low noise amplifier (LNA) 656. The duplexer/switch 646 is designed to operate with a specific receive (RX) to transmit (TX) (RX-to-TX) duplexer frequency separation, such that RX signals are isolated from TX signals. The received RF signal is amplified by the LNA 652 and filtered by a filter 654 to obtain a desired RF input signal. Downconversion mixers 661a and 661b mix the output of the filter 654 with in-phase (I) and quadrature (Q) receive (RX) LO signals (i.e., LO_I and LO_Q) from an RX LO signal generator 680 to generate in-phase (I) and quadrature (Q) baseband signals. The in-phase (I) and quadrature (Q) baseband signals are amplified by amplifiers 626a and 626b and further filtered by lowpass filters 664a and 664b to obtain in-phase (I) and quadrature (Q) analog input signals, which are provided to the data processor 610. In the exemplary configuration shown, the data processor 610 includes analog-to-digital converters (ADCs) 616a and 616b for converting the analog input signals into digital signals for further processing by the data processor 610.

In FIG. 6, the transmit local oscillator (TX LO) signal generator 690 generates the in-phase (I) and quadrature (Q) TX LO signals used for frequency upconversion, while a receive local oscillator (RX LO) signal generator 680 generates the in-phase (I) and quadrature (Q) RX LO signals used for frequency downconversion. Each LO signal is a periodic signal with a particular fundamental frequency. A phase locked loop (PLL) 696 receives timing information from the data processor 610 and generates a control signal used to adjust the frequency and/or phase of the TX LO signals from the TX LO signal generator 690. Similarly, a PLL 686 receives timing information from the data processor 610 and generates a control signal used to adjust the frequency and/or phase of the RX LO signals from the RX LO signal generator 680.

The wireless device 600 may support carrier aggregation and may (i) receive multiple downlink signals transmitted by one or more cells on multiple downlink carriers at different frequencies, and/or (ii) transmit multiple uplink signals to one or more cells on multiple uplink carriers. For intra-band carrier aggregation, the transmissions are sent on different carriers in the same band. For inter-band carrier aggregation, the transmissions are sent on multiple carriers in different bands. Those skilled in the art will understand, however, that aspects described herein may be implemented in systems, devices, and/or architectures that do not support carrier aggregation.

FIG. 7 is a block diagram showing an exemplary wireless communication system 700 in which a configuration of the disclosure may be advantageously employed. For purposes of illustration, FIG. 7 shows three remote units 720, 730, and 780 and two base stations 750. It will be recognized that wireless communication systems may have many more remote units and base stations. Remote units 720, 730, and 780 include IC devices 727A, 727B, and 727C that include the disclosed inductor. It will be recognized that other devices may also include the disclosed inductor, such as the base stations, switching devices, and network equipment. FIG. 7 shows forward link signals 770 from the base station 750 to the remote units 720, 730, and 780 and reverse link signals 790 from the remote units 720, 730, and 780 to base station 750.

In FIG. 7, remote unit 720 is shown as a mobile telephone, remote unit 730 is shown as a portable computer, and remote unit 780 is shown as a fixed location remote unit in a wireless local loop system. For example, a remote unit may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieves data or computer instructions, or combinations thereof. Although FIG. 7 illustrates remote units according to the aspects of the disclosure, the disclosure is not limited to these exemplary illustrated units. Aspects of the disclosure may be suitably employed in many devices, which include the inductor.

Figure 8:
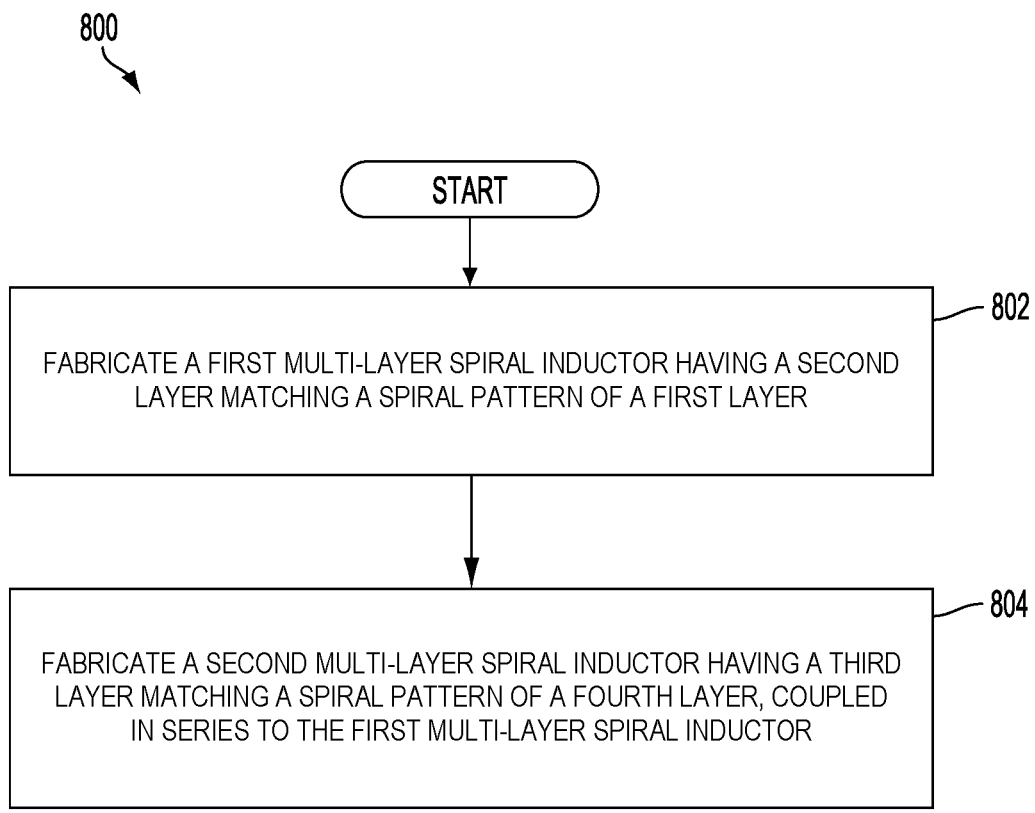
FIG. 8 depicts a simplified flowchart of a method of fabricating a multi-layer inductive array according to aspects of the present disclosure.

FIG. 8 depicts a simplified flowchart 800 of a method of fabricating a multi-layer spiral inductive array. At block 802, a first multi-layer spiral inductor is fabricated. In one configuration, a second layer of the first multi-layer spiral inductor matches a spiral pattern of a first layer of the first multi-layer spiral inductor. At block 804, a second multi-layer spiral inductor is fabricated. In one configuration, a third layer of the second multi-layer spiral inductor matches a spiral pattern of a fourth layer of the second multi-layer spiral inductor. The second multi-layer spiral inductor is coupled, in series, to the first multi-layer spiral inductor. In one configuration, the multi-layer spiral inductive array is fabricated with a laminate substrate process. The substrate may be fabricated from a core layer. Additional layers may be added on both sides of the core layer.

According to a further aspect of the present disclosure, a multi-layer spiral inductive array is described. The array may include a first means for providing inductance. The first means may be multi-layered with a second layer matching a spiral pattern of a first layer. The array may also include a second means for providing inductance. The second means may be multi-layered with a third layer matching a spiral pattern of a fourth layer. The first means may be, for example, the first multi-layer serial inductor 302, the second multi-layer serial inductor 304, or the third multi-layer serial inductor 312, as shown in FIG. 3A. The second means for inductance may be, for example, the first multi-layer serial inductor 302, the second multi-layer serial inductor 304, or the third multi-layer serial inductor 312, as shown in FIG. 3A. In another aspect, the aforementioned means may be any module, layer or apparatus configured to perform the functions recited by the aforementioned means.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A multi-layer spiral inductive array, comprising:
    a first multi-layer spiral inductor having a second layer matching a spiral pattern of a first layer, the first multi-layer spiral inductor comprising a bridge coupling a stack of vias to a center portion of the first multi-layer spiral inductor, a first end of the bridge coupled to the stack of vias and a second end of the bridge coupled to the center portion; and
    a second multi-layer spiral inductor having a third layer matching a spiral pattern of a fourth layer, the second multi-layer spiral inductor coupled in series with the first multi-layer spiral inductor, an outermost trace of a second outer layer of the first multi-layer spiral inductor coupled to an outermost trace of an outer layer of the second multi-layer spiral inductor.

2. The multi-layer spiral inductive array of claim 1, in which a turn radius of an inner spiral of the first multi-layer spiral inductor is less than twice a trace width of an inner trace of the first multi-layer spiral inductor.

3. The multi-layer spiral inductive array of claim 1, in which the second layer of the first multi-layer spiral inductor is coupled to the first layer of the first multi-layer spiral inductor at a center of the first multi-layer spiral inductor.

4. The multi-layer spiral inductive array of claim 1, in which the first multi-layer spiral inductor and the second multi-layer spiral inductor form a power amplifier radio frequency (RF) choke inductor.

5. The multi-layer spiral inductive array of claim 4, further comprising a ground wall surrounding the power amplifier RF choke inductor.

6. The multi-layer spiral inductive array of claim 1, further comprising a third multi-layer spiral inductor, coupled in series with the second multi-layer spiral inductor.

7. The multi-layer spiral inductive array of claim 1, in which the first layer is above the second layer and the fourth layer is above the third layer.

8. The multi-layer spiral inductive array of claim 1, integrated into a mobile phone, a set top box, a music player, a video player, an entertainment unit, a navigation device, a computer, a hand-held personal communication systems (PCS) unit, a portable data unit, and/or a fixed location data unit.

9. A method of fabricating a multi-layer spiral inductive array, comprising:
    fabricating a first multi-layer spiral inductor having a second layer matching a spiral pattern of a first layer, the first multi-layer spiral inductor comprising a bridge coupling a stack of vias to a center portion of the first multi-layer spiral inductor, a first end of the bridge coupled to the stack of vias and a second end of the bridge coupled to the center portion; and fabricating a second multi-layer spiral inductor having a third layer matching a spiral pattern of a fourth layer, the second multi-layer spiral inductor coupled in series to the first multi-layer spiral inductor, an outermost trace of a second outer layer of the first multi-layer spiral inductor coupled to an outermost trace of an outer layer of the second multi-layer spiral inductor.

10. The method of claim 9, further comprising fabricating a turn radius of an inner spiral of the first multi-layer spiral inductor to be less than twice a trace width of an inner trace of the first multi-layer spiral inductor.

11. The method of claim 9, further comprising coupling the first layer of the first multi-layer spiral inductor to the second layer of the first multi-layer spiral inductor at a center of the first multi-layer spiral inductor.

12. The method of claim 9, further comprising fabricating a ground wall to surround the first multi-layer spiral inductor and the second multi-layer spiral inductor.

13. The method of claim 9, further comprising:
fabricating a third multi-layer spiral inductor, coupled in series with the second multi-layer spiral inductor.

14. The method of claim 9, further comprising fabricating the first layer above the second layer and the fourth layer above the third layer.

15. The method of claim 9, further comprising integrating the multi-layer spiral inductive array into a mobile phone, a set top box, a music player, a video player, an entertainment unit, a navigation device, a computer, a hand-held personal communication systems (PCS) unit, a portable data unit, and/or a fixed location data unit.

16. An apparatus for inductance, comprising:
a first means for providing inductance having a second layer matching a spiral pattern of a first layer, the first means for providing inductance comprising a bridge coupling a stack of vias to a center portion of the means for providing inductance, a first end of the bridge coupled to the stack of vias and a second end of the bridge coupled to the center portion; and
a second means for providing inductance having a third layer matching a spiral pattern of a fourth layer, the second means for providing inductance coupled in series with the first means for providing inductance, an outermost trace of a second outer layer of the first means for providing inductance coupled to an outermost trace of an outer layer of the second means for providing inductance.

17. The apparatus of claim 16, in which a turn radius of an inner spiral of the first means is less than twice a trace width of an inner trace of the first means.

18. The apparatus of claim 16, in which the second layer of the first means is coupled to the first layer of the first means at a center of the first means.

19. The apparatus of claim 16, integrated into a mobile phone, a set top box, a music player, a video player, an entertainment unit, a navigation device, a computer, a hand-held personal communication systems (PCS) unit, a portable data unit, and/or a fixed location data unit.

\* \* \* \* \*